United States Patent
Suzuki et al.

(10) Patent No.: US 10,825,866 B2
(45) Date of Patent: Nov. 3, 2020

(54) MEMORY DEVICE

(71) Applicant: TOSHIBA MEMORY CORPORATION, Minato-ku, Tokyo (JP)

(72) Inventors: Kunifumi Suzuki, Yokkaichi Mie (JP); Kazuhiko Yamamoto, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 124 days.

(21) Appl. No.: 15/910,690

(22) Filed: Mar. 2, 2018

(65) Prior Publication Data

US 2019/0088716 A1  Mar. 21, 2019

(30) Foreign Application Priority Data

Sep. 20, 2017 (JP) .................................. 2017-179811

(51) Int. Cl.
*H01L 45/00* (2006.01)
*H01L 27/24* (2006.01)
*G11C 13/00* (2006.01)

(52) U.S. Cl.
CPC ........ *H01L 27/249* (2013.01); *G11C 13/0004* (2013.01); *G11C 13/0007* (2013.01); *G11C 13/0026* (2013.01); *G11C 13/0028* (2013.01); *H01L 45/08* (2013.01); *H01L 45/1226* (2013.01); *H01L 45/1233* (2013.01); *H01L 45/1246* (2013.01); *H01L 45/1253* (2013.01); *H01L 45/146* (2013.01); *H01L 45/1641* (2013.01); *G11C 13/0069* (2013.01); *G11C 13/0097* (2013.01); *G11C 2013/009* (2013.01); *G11C 2013/0078* (2013.01);
(Continued)

(58) Field of Classification Search
CPC ............. H01L 45/1233; H01L 45/1226; H01L 45/1246; H01L 45/146; H01L 45/08; H01L 27/249; G11C 13/0007; G11C 13/0028; G11C 13/0026; G11C 2213/51; G11C 2213/32; G11C 2213/77; G11C 2213/71
See application file for complete search history.

(56) References Cited

U.S. PATENT DOCUMENTS 8,817,514 B2  8/2014  Samachisa et al.
8,872,256 B2 * 10/2014  Lee .................... H01L 27/1052
                                                         257/326
(Continued)

*Primary Examiner* — Michael M Trinh
(74) *Attorney, Agent, or Firm* — Foley & Lardner LLP

(57) ABSTRACT

A memory device is described. A first conductive layer extends in a first direction. A second conductive layer extends in the first direction. A third conductive layer extends in a second direction intersecting the first direction. A first oxide region is disposed between the first conductive layer and the third conductive layer and between the second conductive layer and the third conductive layer. A semiconductor region is disposed between the first conductive layer and the first oxide region and between the first conductive layer and the second conductive layer. A second distance between the semiconductor region, which is disposed between the first conductive layer and the second conductive layer, and the third conductive layer, is longer than a first distance between the semiconductor region, which is disposed between the first conductive layer and the first oxide region, and the third conductive layer.

16 Claims, 9 Drawing Sheets

(52) U.S. Cl.
CPC ...... *G11C 2213/32* (2013.01); *G11C 2213/51* (2013.01); *G11C 2213/71* (2013.01); *G11C 2213/77* (2013.01)

(56) References Cited

U.S. PATENT DOCUMENTS

| | | | |
|---|---|---|---|
| 9,099,496 B2* | 8/2015 | Tian | H01L 29/66825 |
| 9,659,955 B1* | 5/2017 | Sharangpani | H01L 27/11582 |
| 2009/0242956 A1* | 10/2009 | Heng | H01L 29/513 |
| | | | 257/316 |
| 2012/0049268 A1* | 3/2012 | Chang | H01L 27/11551 |
| | | | 257/324 |
| 2013/0200331 A1 | 8/2013 | Morikawa et al. | |
| 2015/0060992 A1 | 3/2015 | Taekyung et al. | |
| 2019/0067374 A1* | 2/2019 | Franca-Neto | H01L 27/2454 |

* cited by examiner

MEMORY DEVICE

CROSS-REFERENCE TO RELATED APPLICATION

This application claims the benefit of and priority to Japanese Patent Application No. 2017-179811, filed Sep. 20, 2017, the entire contents of which are incorporated herein by reference.

FIELD

Embodiments described herein relate generally to a memory device.

BACKGROUND

The development of a two-terminal resistive random access memory that is an alternative to a conventional floating gate NAND flash memory has gained momentum as a large capacity nonvolatile memory. A memory of this type is capable of low-voltage, low-current operation, high-speed switching, and miniaturization and high integration of memory cells.

Various materials have been proposed for a resistance change layer of the resistive random access memory. For example, an electrical resistance changes by changing band structures of titanium oxide and amorphous silicon that acts as a barrier film using modulation of a vacancy density by applying a bias.

In a large capacity memory array, many metal interconnections called bit lines and word lines are arranged to intersect one another and memory cells are formed at points of intersection between the bit lines and the word lines. Data is written to a memory cell by applying a voltage to a bit line BL and a word line WL connected to the cell.

DETAILED DESCRIPTION

Figure 1:
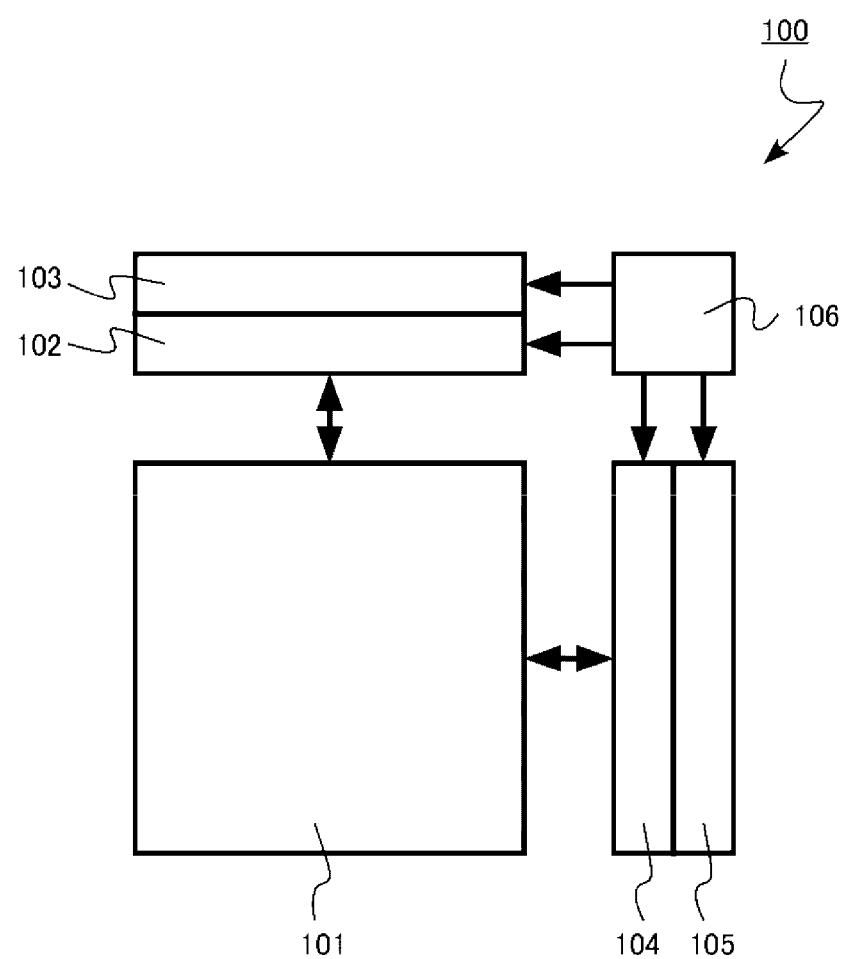
FIG. 1 is a block diagram of a memory device according to a first embodiment.

Exemplary embodiments provide a memory device with improved reliability.

According to one embodiment, a memory device may include: a first conductive layer extending in a first direction; a second conductive layer extending in the first direction; a third conductive layer extending in a second direction intersecting the first direction; a first oxide region provided between the first conductive layer and the third conductive layer and between the second conductive layer and the third conductive layer; and a semiconductor region provided between the first conductive layer and the first oxide region and between the first conductive layer and the second conductive layer. A second distance between the semiconductor region, which is provided between the first conductive layer and the second conductive layer, and the third conductive layer, is longer than a first distance between the semiconductor region, which is provided between the first conductive layer and the first oxide region, and the third conductive layer.

Embodiments will be described hereinafter with reference to the drawings. In the drawings, same or similar elements are denoted by same or similar reference signs.

(First Embodiment)

A memory device according to a first embodiment includes: a first conductive layer extending in a first direction; a second conductive layer extending in the first direction; a third conductive layer extending in a second direction intersecting the first direction; a first oxide region provided between the first conductive layer and the third conductive layer and between the second conductive layer and the third conductive layer; and a semiconductor region provided between the first conductive layer and the first oxide region and between the first conductive layer and the second conductive layer. A second distance between the semiconductor region, which is provided between the first conductive layer and the second conductive layer, and the third conductive layer, is longer than a first distance between the semiconductor region, which is provided between the first conductive layer and the first oxide region, and the third conductive layer.

Figure 2:
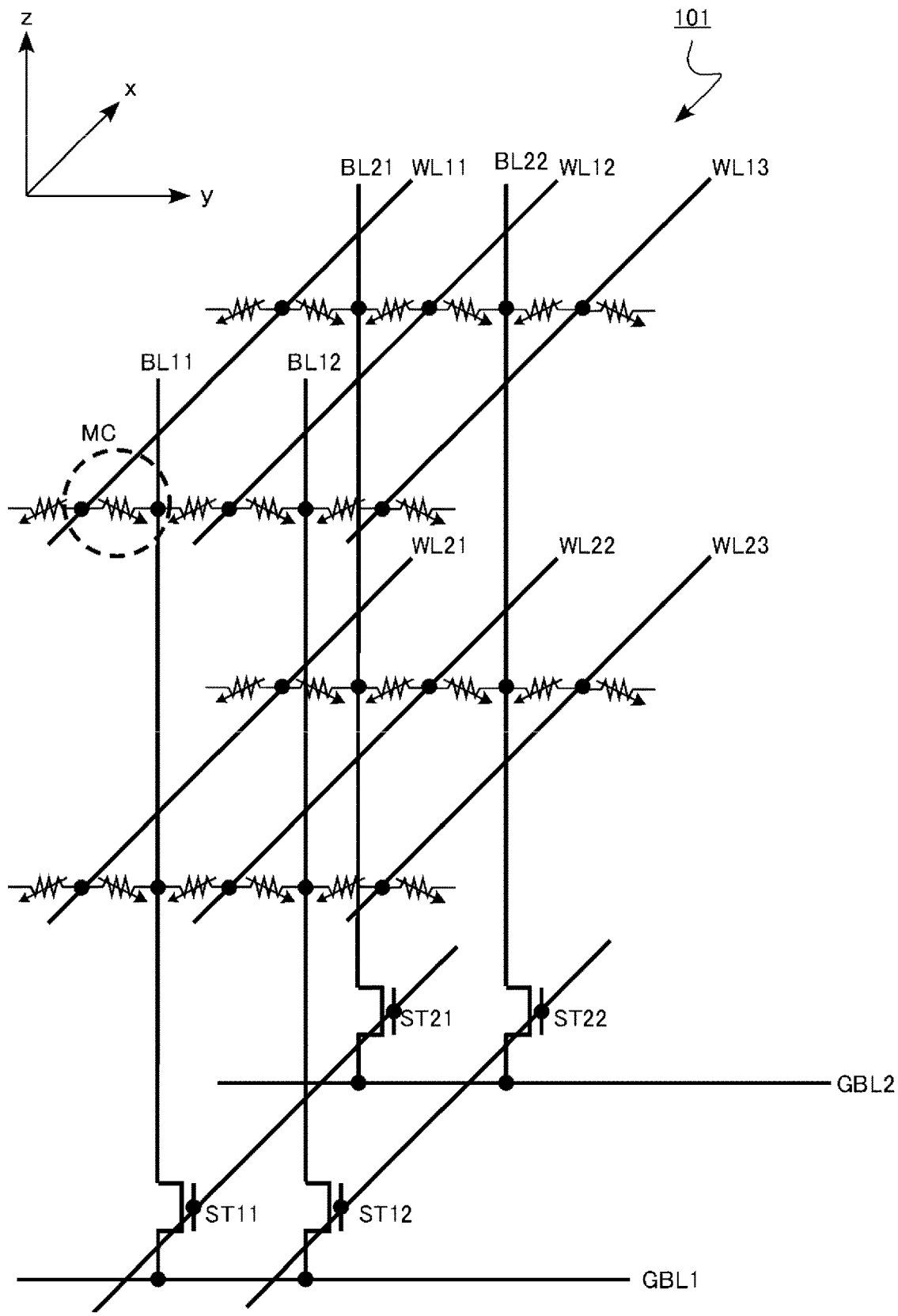
FIG. 2 is an equivalent circuit diagram of a memory cell array according to the first embodiment.

FIG. 1 is a block diagram of a memory device according to an embodiment. FIG. 2 is an equivalent circuit diagram of a memory cell array 101. FIG. 2 typically shows a wiring structure in the memory cell array 101.

A memory device 100 according to the present embodiment is a phase change memory. The phase change memory stores data using a resistance change with a change in a crystal structure of a variable resistance layer.

Furthermore, the memory cell array 101 according to the present embodiment has a three-dimensional structure in which memory cells are arranged three-dimensionally. The three-dimensional structure improves a degree of integration of the memory device 100.

As shown in FIG. 1, the memory device 100 includes the memory cell array 101, a word line driver circuit 102, a row decoder circuit 103, a sense amplifier circuit 104, a column decoder circuit 105, and a control circuit 106.

Moreover, as shown in FIG. 2, a plurality of memory cells MC are disposed three-dimensionally within the memory cell array 101. In FIG. 2, a region surrounded by a broken line corresponds to one memory cell MC.

The memory cell array 101 includes, for example, a plurality of word lines WL (WL11, WL12, WL13, WL21, WL22, and WL23) and a plurality of bit lines BL (BL11, BL12, BL21, and BL22). The word lines WL extend in an x direction. The bit lines BL extend in a z direction. The word lines WL and the bit lines BL may intersect one another perpendicularly, for example. The memory cells MC are disposed at portions of intersection between the word lines WL and the bit lines BL.

The x direction is a specific example of a first direction, a y direction is a specific example of a third direction, and the z direction is a specific example of a second direction.

The plurality of word lines WL are electrically connected to the row decoder circuit 103. The plurality of bit lines BL are connected to the sense amplifier circuit 104. Select transistors ST (ST11, ST21, ST12, and ST22) and global bit lines GBL (GBL1 and GBL2) are provided between the plurality of bit lines BL and the sense amplifier circuit 104.

The row decoder circuit 103 has a function to select a word line WL in accordance with an input row address signal. The word line driver circuit 102 has a function to apply a predetermined voltage to the word line WL selected by the row decoder circuit 103.

The column decoder circuit 105 has a function to select a bit line BL in accordance with an input column address signal. The sense amplifier circuit 104 has a function to apply a predetermined voltage to the bit line BL selected by the column decoder circuit 105. In addition, the sense amplifier circuit 104 has a function to detect and amplify a current flowing between the selected word line WL and the selected bit line BL.

The control circuit 106 has a function to control the word line driver circuit 102, the row decoder circuit 103, the sense amplifier circuit 104, the column decoder circuit 105, and other circuits that are not shown.

The circuits such as the word line driver circuit 102, the row decoder circuit 103, the sense amplifier circuit 104, the column decoder circuit 105, and the control circuit 106 are electronic circuits. The electronic circuits are each configured with, for example, a transistor using a semiconductor layer and a wiring layer that are not shown.

Figure 3:
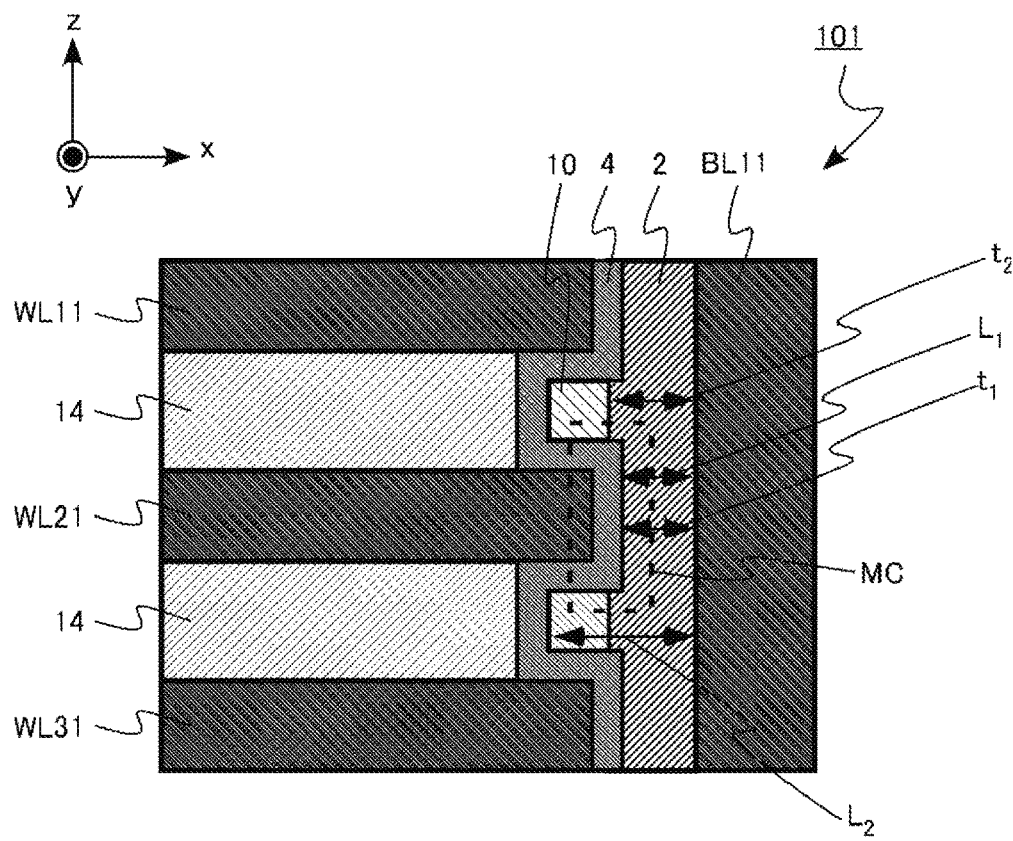
FIG. 3 is a pattern cross-sectional view of the memory device according to the first embodiment.

FIG. 3 is a pattern cross-sectional view of the memory cell array 101 of the memory device 100 according to the present embodiment. FIG. 3 is an xz cross-sectional view of the memory cell array 101. In FIG. 3, a region surrounded by a broken line is one memory cell MC.

The memory cell array 101 includes the word line WL11, the word line WL21 (first conductive layer), the word line WL31 (second conductive layer), the bit line BL11 (third conductive layer), a first oxide region 2, a semiconductor region 4, a first insulator 10, and a third insulator 14.

The word lines WL11, WL21, WL31, and the like are often generically and simply referred to as "word lines WL", hereinafter. In addition, the bit lines BL11, BL21, BL12, and the like are often generically and simply referred to as "bit lines BL", hereinafter.

The word lines WL are conductive layers. The word lines WL are, for example, metal layers. The word lines WL contain, for example, tungsten, titanium nitride, or steel. The word lines WL may be formed from a conductive material such as the other metal, a metal semiconductor compound, or a semiconductor.

The bit lines BL are conductive layers. The bit lines BL may be, for example, metal layers. The bit lines BL contain, for example, tungsten, titanium nitride, or copper. The bit lines BL may be formed from a conductive material such as a metal, a metal semiconductor compound, or a semiconductor.

A pitch of the word lines WL in the y direction may be, for example, equal to or larger than 50 nm and equal to or smaller than 200 nm. A thickness of the word lines WL in the z direction is, for example, equal to or smaller than 30 nm. A pitch of the bit lines BL in the x direction may be, for example, equal to or larger than 50 nm and equal to or smaller than 200 nm.

The pitch of the word lines WL in the y direction, the thickness of the word lines WL in the z direction, and the pitch of the bit lines BL in the x direction can be measured by observation with, for example, a transmission electron microscope.

The word lines WL21 and WL31 extend in the x direction. The bit line BL11 extends in the z direction intersecting the x direction.

The first oxide region 2 is provided between the word line WL21 and the bit line BL11 and between the word line WL31 and the bit line BL11. The first oxide region 2 may contain titanium oxide, tungsten oxide, or niobium oxide. The first oxide region 2 is a transition metal oxide narrower in band gap than the semiconductor region 4 to be described later. A film thickness of the first oxide region 2 is preferably, for example, equal to or larger than six nm for obtaining favorable crystallinity.

The third insulator 14 is provided between the word lines WL, for example, between the word lines WL21 and WL31. The third insulator 14 contains, for example, oxide, oxynitride, or nitride. The third insulator 14 may be, for example, silicon oxide.

The first insulator 10 is provided between the third insulator 14 and the first oxide region 2. The first insulator 10 may contain, for example, oxide, oxynitride, or nitride. The first insulator 10 may be, for example, silicon oxide. A film thickness of the first insulator 10 is, for example, equal to or larger than two nm. A dielectric constant of the first insulator 10 is preferably lower than that of the first oxide region 2.

The semiconductor region 4 is provided between the third insulator 14 and the first insulators 10, between the word line WL21 and the first insulator 10, and between the word line WL21 and the first oxide region 2. The semiconductor region 4 between the third insulators 14 and the first insulator 10 and the semiconductor region 4 between the word line WL21 and the first insulator 10 are provided between the word lines WL21 and WL31. The semiconductor region 4 may contain, for example, silicon or germanium. The semiconductor region 4 is, for example, silicon, silicon germanium, or germanium. The semiconductor region 4 may be, for example, amorphous silicon. A film thickness of the semiconductor region 4 is preferably equal to or larger than 3.5 nm for obtaining a favorable film quality, and preferably equal to or smaller than ten nm for preventing an increase in an operating voltage.

It is preferable that a second film thickness $t_2$ of the first oxide region 2 between the first insulator 10 and the bit line BL11 is larger than a first film thickness $t_1$ of the first oxide region 2 between the word line WL21 and the bit line BL11 for facilitating formation of the memory device 100.

writing of data will be described. First, a voltage is applied to one word line WL or bit line BL. Next, a vacancy density of an interface between the first oxide region 2 and the semiconductor region 4, which serves as a barrier film, that are provided between the word line WL and the bit line BL is modulated. A band structure of the interface between the first oxide region 2 and the semiconductor region 4 is then changed. A resistance of the memory cell MC is thereby changed to write data to the memory cell MC.

A second distance between the semiconductor region 4, which is provided between the word lines WL21 and WL31 (between the third insulator 14 and the first insulator 10), and the bit line BL11 is longer than a first distance between the semiconductor region 4, which is provided between the word line WL21 and the first oxide region 2, and the bit line BL11.

A memory device manufacturing method according to the present embodiment will next be described.

FIGS. 4, 5, 6, 7, 8, and 9 are pattern cross-sectional views showing the memory device that is being manufactured in the memory device manufacturing method according to the present embodiment.

Figure 4:
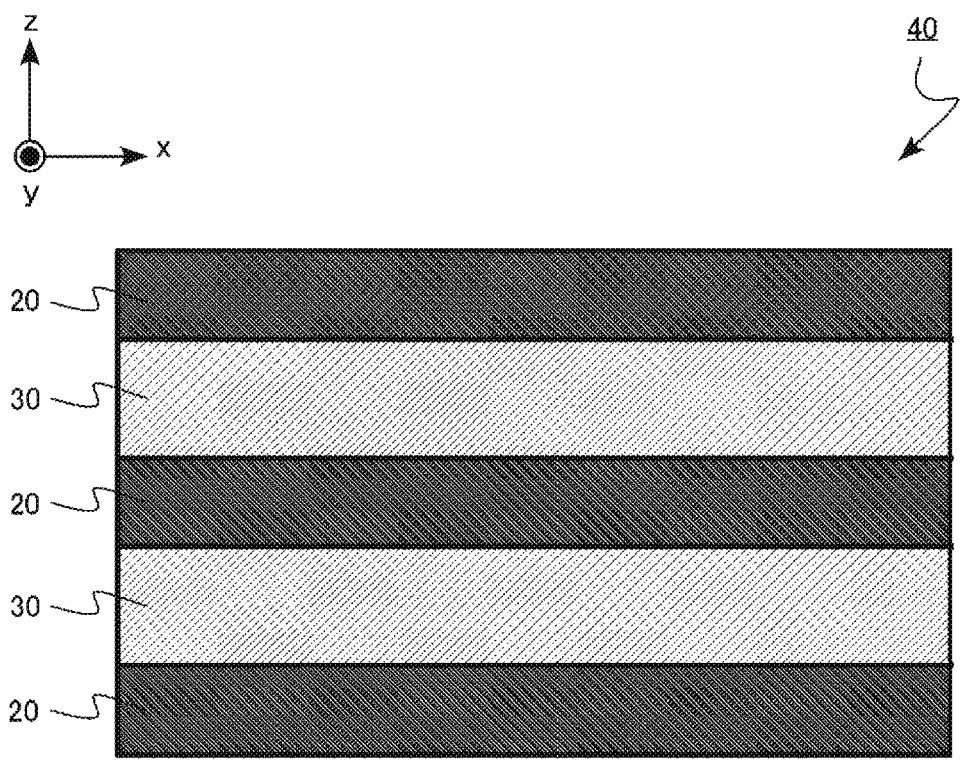
FIG. 4 is a pattern cross-sectional view showing the memory device that is being manufactured in a memory device manufacturing method according to the first embodiment.

First, a conductive material 20 that may contain, for example, tungsten (W), titanium nitride (TiN), or copper (Cu) is formed, and an insulating material 30 that may contain, for example, oxide, oxynitride, or nitride is formed on the conductive material 20. This procedure is repeated to form a stacked structure 40 of a plurality of conductive materials 20 and a plurality of insulating materials 30 (FIG. 4).

Figure 5:
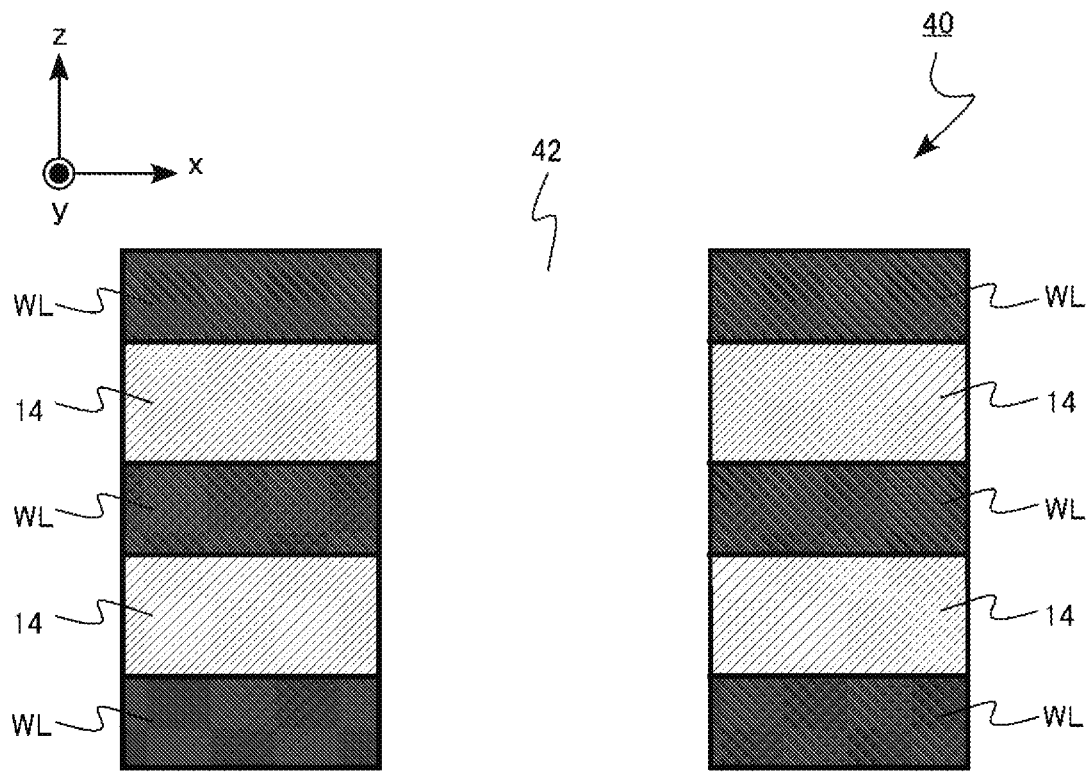
FIG. 5 is a pattern cross-sectional view showing the memory device that is being manufactured in the memory device manufacturing method according to the first embodiment.

Next, a vacancy 42 is formed in the stacked structure 40 (FIG. 5). The conductive materials 20 serve as the word lines WL, while the insulating materials 30 serve as the third insulators 14.

Figure 6:
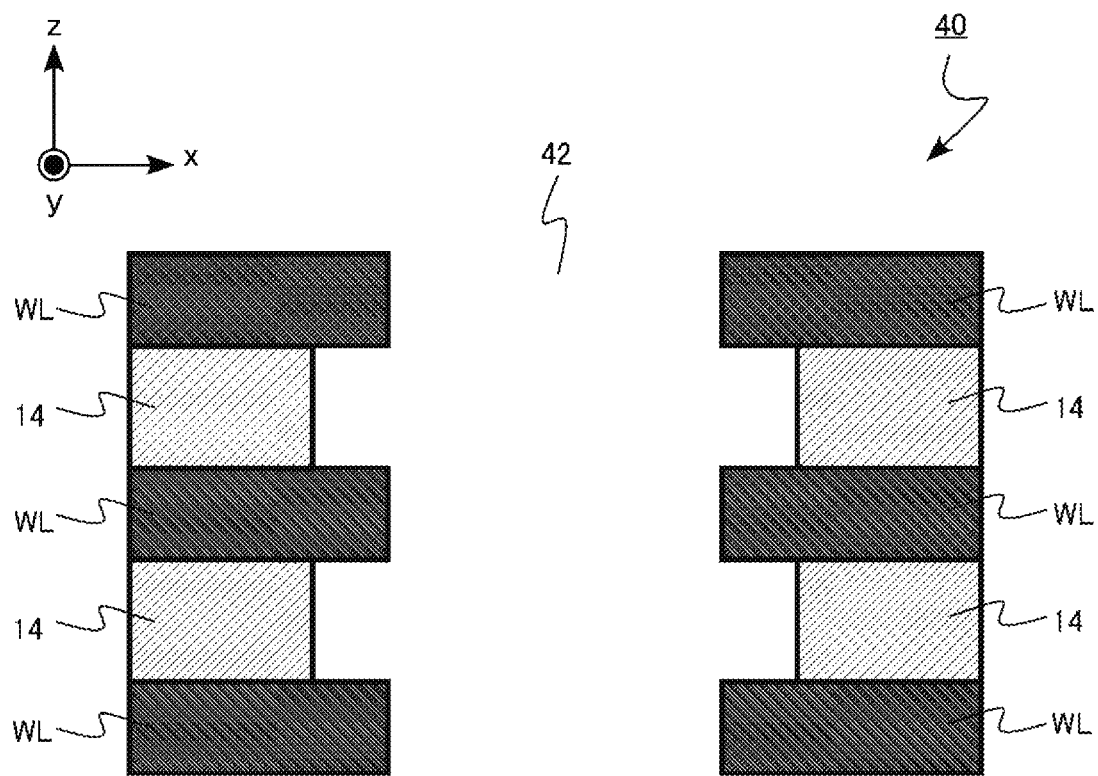
FIG. 6 is a pattern cross-sectional view showing the memory device that is being manufactured in the memory device manufacturing method according to the first embodiment.

Next, the third insulators 14 around the vacancy 42 are partially removed by, for example, wet etching (FIG. 6).

Figure 7:
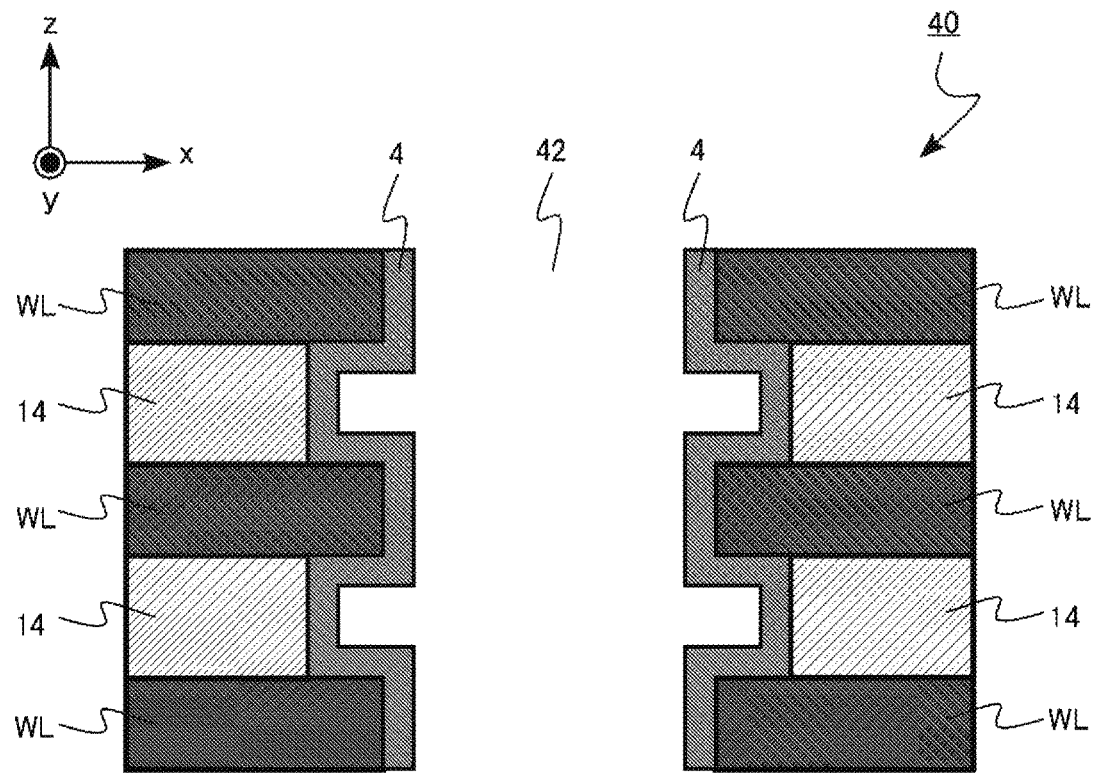
FIG. 7 is a pattern cross-sectional view showing the memory device that is being manufactured in the memory device manufacturing method according to the first embodiment.

Next, the semiconductor regions 4 that may contain, for example, silicon or germanium are formed on front surfaces of the third insulators 14 and the word lines WL around the vacancy 42 (FIG. 7).

Figure 8:
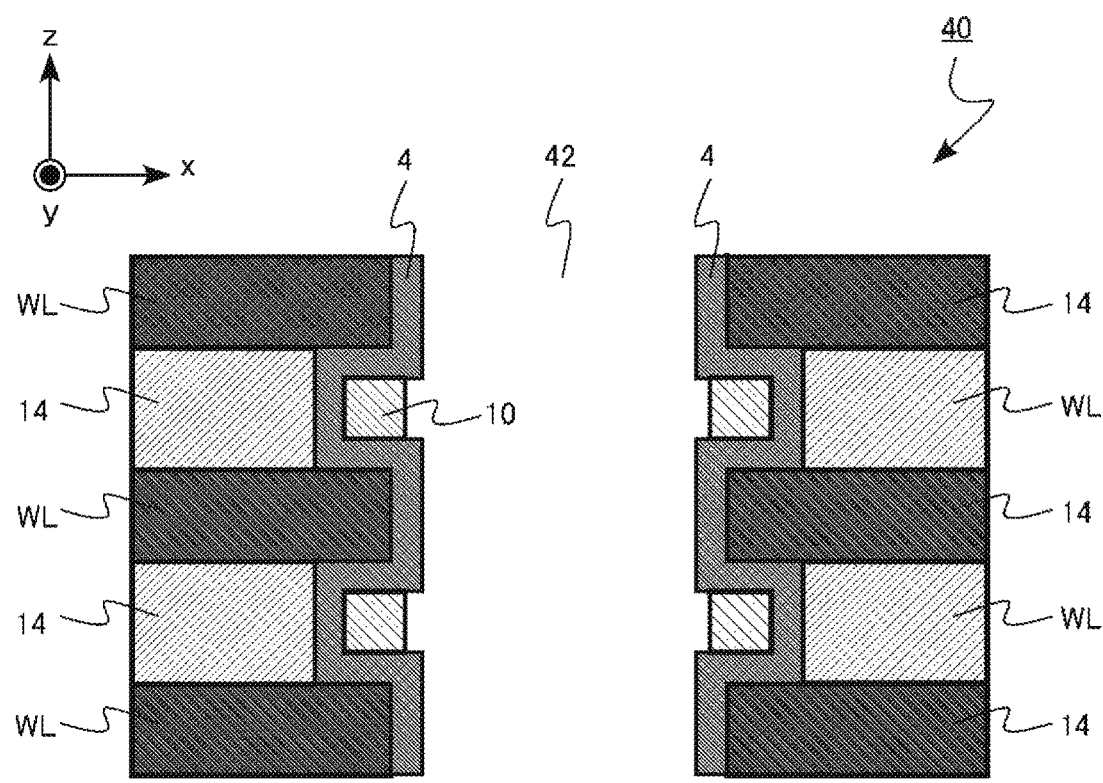
FIG. 8 is a pattern cross-sectional view showing the memory device that is being manufactured in the memory device manufacturing method according to the first embodiment.

Next, insulators are formed on front surfaces of the semiconductor regions 4 around the vacancy 42 and the excess insulators formed are then removed by etching or the like. The first insulators 10 are thereby formed on opposite sides of the semiconductor regions 4 to the third insulators 14 (FIG. 8).

Next, the first oxide regions 2 that may contain, for example, titanium oxide are formed on front surfaces of the first insulators 10 and the semiconductor regions 4 around the vacancy 42.

Next, a heat treatment is conducted at a temperature, for example, equal to or higher than 400° C. and equal to or lower than 1000° C. This heat treatment makes titanium oxide, for example, contained in the first oxide regions 2, into an anatase structure, and makes it possible to modulate a vacancy density by an electric field.

Figure 9:
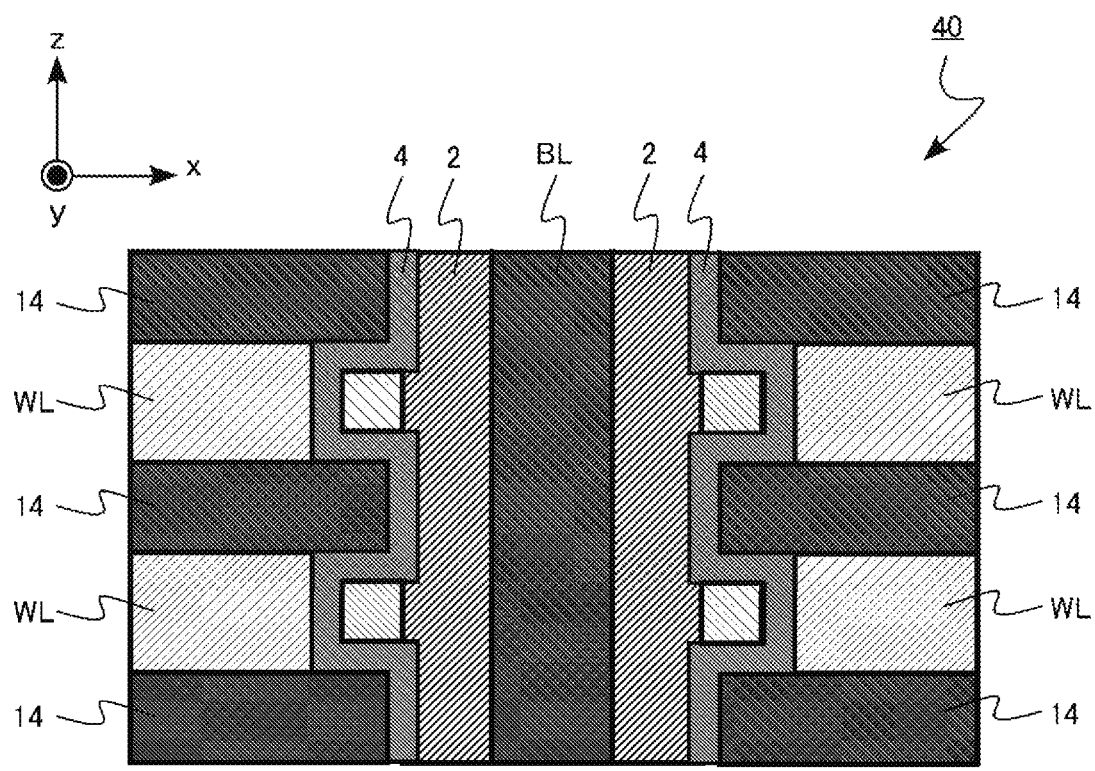
FIG. 9 is a pattern cross-sectional view showing the memory device that is being manufactured in the memory device manufacturing method according to the first embodiment.

Next, the bit lines BL that contain, tungsten (W), titanium oxide (TiN), or copper (Cu) are formed on front surfaces of the first oxide regions 2, thus obtaining the memory device 100 according to the present embodiment (FIG. 9).

Advantages and effects of the present embodiment will next be described.

Figure 10:
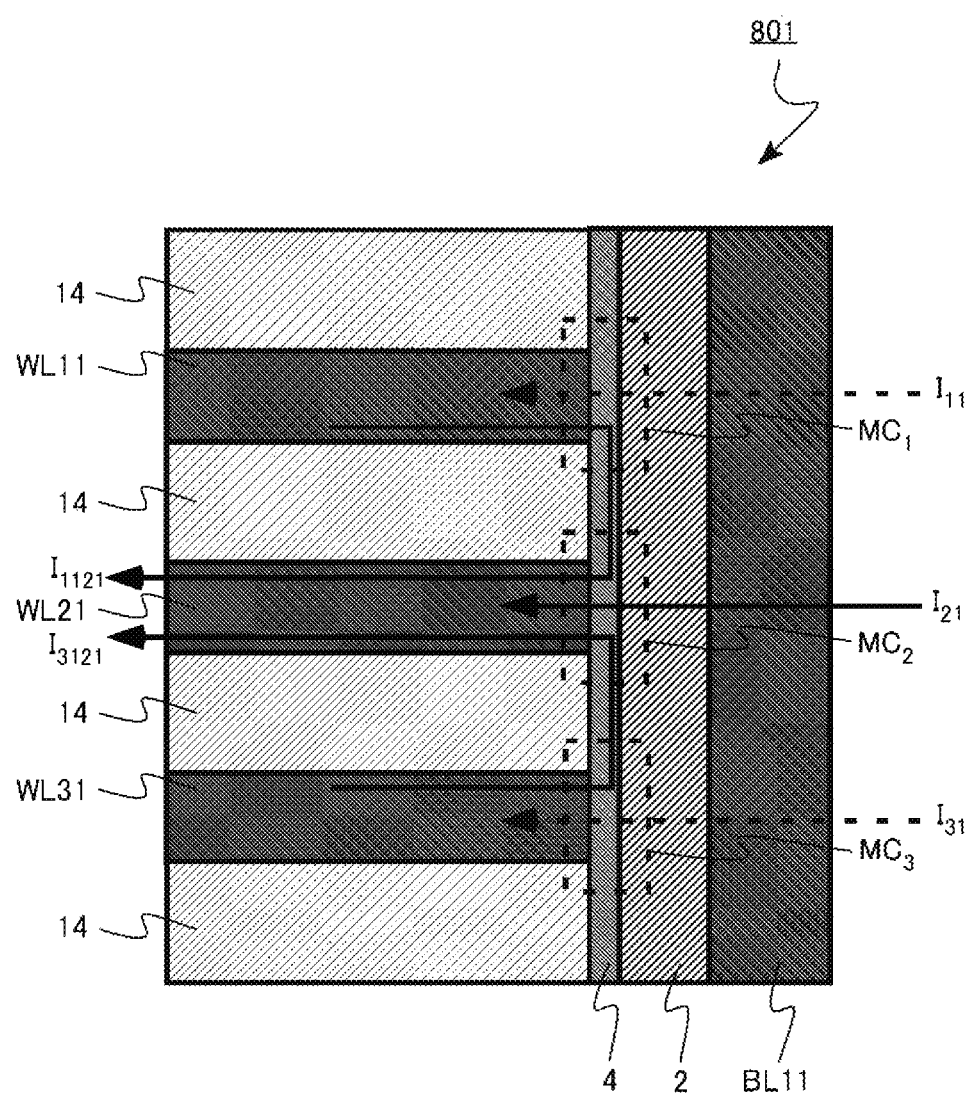
FIG. 10 is an explanatory diagram of a memory device according to a comparison to the first embodiment.

FIG. 10 is a pattern diagram of a memory cell array 801 according to a comparison to the first embodiment. The first insulators 10 are not provided in the memory cell array 801. Furthermore, the first distance between the semiconductor region 4, which is provided between the word line WL21 and the first oxide region 2, and the bit line BL11 is equal to the second distance between the semiconductor region 4, which is provided between the word lines WL21 and WL31, and the bit line BL11.

By applying a voltage to a memory cell, a resistance state of the memory cell changes from a high resistance state to a low resistance state or from the low resistance state to the high resistance state. A change from the high resistance state to the low resistance state is referred to as, for example, "set operation". In addition, a change from the low resistance state to the high resistance state is referred to as, for example, "reset operation".

A case in which the reset operation is performed on a memory cell $MC_2$ and no reset operation is performed on memory cells $MC_1$ and $MC_3$ will be described by way of example. A voltage applied to the bit line BL11 is V. Furthermore, a voltage applied to the word line WL21 (selected word line WL) is zero V, and a voltage applied to the word lines WL11 and WL31 (non-selected word lines WL) is ½ V.

When a normal reset operation is performed, a current $I_{21}$ flows from the bit line BL11 to the word line WL21. Moreover, currents $I_{11}$ and $I_{31}$ lower than the current $I_{21}$ flow from the bit line BL11 to the word line WL11 and from the bit line BL11 to the word line WL31, respectively.

When the voltage V increases, a current like $I_{1121}$ flowing in the word line WL11 in a rightward direction in FIG. 10, flowing between the first oxide region 2 and the semiconductor region 4 in a downward direction in FIG. 10, and flowing in the word line WL21 in a leftward direction in FIG. 10 is generated. That is, the current flowing to sneak from the word line WL11 into the word line WL21 is generated.

In addition, a current like $I_{3121}$ flowing in the word line WL31 in the rightward direction in FIG. 10, flowing between the first oxide region 2 and the semiconductor region 4 in an upward direction in FIG. 10, and flowing in the word line WL21 in the leftward direction in FIG. 10 is generated. That is, the current flowing to sneak from the word line WL31 into the word line WL21 is generated.

The sneak currents $I_{1121}$ and $I_{3121}$ are higher than the currents $I_{11}$ and $I_{31}$. This produces a problem that a fault arising from the currents is induced and the material used for the semiconductor region 4 degrades. In addition, setting an electric field near the word line WL21 (selected word line WL) to be weak and setting electric fields near the word lines WL11 and WL31 (non-selected word lines WL) to be strong produces a problem that a reset operation failure occurs.

Moreover, a problem occurs that the sneak currents are also generated when a read voltage is high in a read operation.

A reason for the occurrence of such problems is that a virtual TFT (Thin Film Transistor) which is provided between the memory cells MC and for which it is assumed that the bit line BL11 is a gate, the word lines WL11 and WL21 or the word lines WL21 and WL31 are a source and a drain, and the first oxide region 2 is a gate insulating film is turned on.

In the memory device 100 according to the present embodiment, the second distance between the semiconductor region 4, which is provided between the word lines WL21 and WL31, and the bit line BL11 is longer than the first distance between the semiconductor region 4, which is provided between the word line WL21 and the first oxide region 2, and the bit line BL11. This weakens an electric field applied from the bit line BL11 to the semiconductor region 4. It is thereby possible to make it difficult to turn on the virtual TFT described above and to prevent the sneak currents.

Providing the first insulator 10 between the first oxide region 2 and the semiconductor region 4 which is provided between the word lines WL21 and WL31 can make the second distance between the semiconductor region 4, which is provided between the word lines WL21 and WL31, and the bit line BL11 longer than the first distance between the semiconductor region 4, which is provided between the word line WL21 and the first oxide region 2, and the bit line BL11. In essence, the first insulator 10 contributes to increasing the film thickness of the gate insulating film of the virtual TFT and to making it difficult to turn on the virtual TFT.

The dielectric constant of the first insulator 10 is preferably lower than that of the first oxide region 2 for preventing the sneak currents.

According to the present embodiment, it is possible to provide a memory device with improved reliability.

(Second Embodiment)

A memory device according to a second embodiment differs from that according to the first embodiment by further including a second oxide region provided between the semiconductor region and the first oxide region. Contents overlapping with those of the first embodiment will not be described herein.

Figure 11:
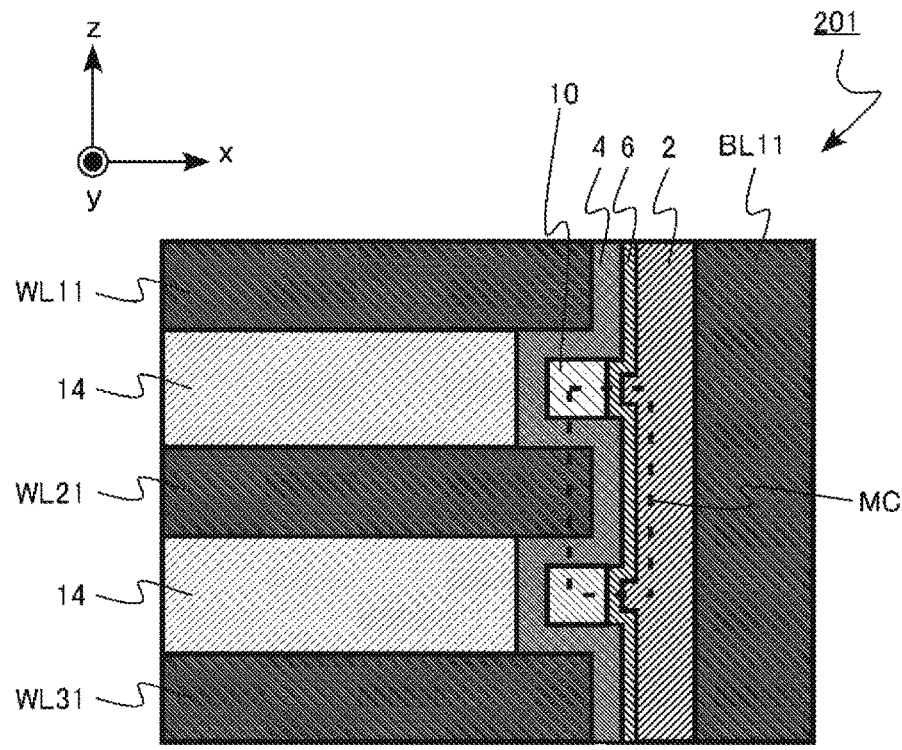
FIG. 11 is a pattern cross-sectional view of a memory device according to a second embodiment.

FIG. 11 is a pattern cross-sectional view of a memory cell array 201 of a memory device 200 according to the present embodiment. In the memory cell array 201 according to the present embodiment, a second oxide region 6 is provided between the first oxide region 2 and the semiconductor region 4 and between the first insulator 10 and the first oxide region 2.

The second oxide region 6 functions as a reaction inhibiting layer between the first oxide region 2 and the semiconductor region 4. This can inhibit elements from coming and going between the first oxide region 2 and the semiconductor region 4, so that reliability is further improved.

A film thickness of the second oxide region 6 is preferably equal to or smaller than two nm and more preferably equal to or smaller than 0.8 nm for achieving miniaturization of the memory cells MC. The second oxide region 6 preferably contains aluminum oxide, hafnium oxide, or zirconium oxide.

According to the present embodiment, it is possible to provide a memory device with further improved reliability.

(Third Embodiment)

A memory device according to a third embodiment differs from those according to the first and second embodiments by further including a second insulator provided between the first conductive layer and the semiconductor region. Contents overlapping with those of the first and second embodiments will not be described herein.

Figure 12:
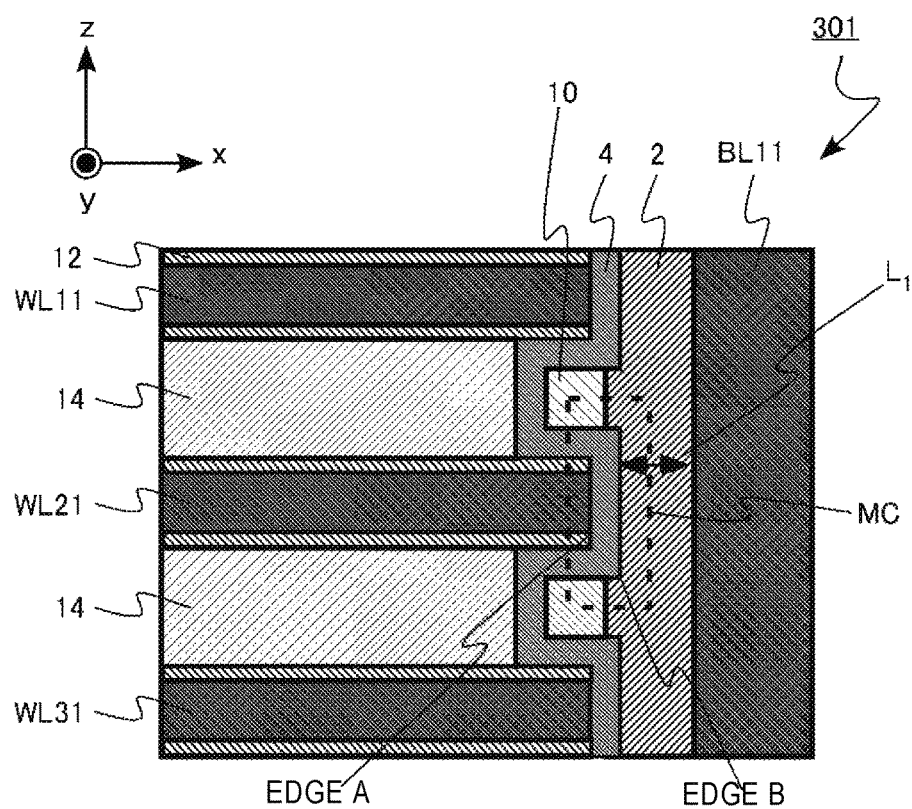
FIG. 12 is a pattern cross-sectional view of a memory device according to a third embodiment.

FIG. 12 is a pattern cross-sectional view of a memory cell array 301 of a memory device 300 according to the present embodiment. In the memory cell array 301 according to the present embodiment, a second insulator 12 is provided between the word line WL21 and the third insulator 14 and between the semiconductor region 4, which is between the word line WL21 and the first insulator 10, and the word line WL21. The second insulator 12 is used to prevent breakdown of the memory cells MC due to electric field concentration by extending a distance between edges A and B on which the electric field concentrates.

According to the present embodiment, it is possible to provide a memory device with further improved reliability.

(Fourth Embodiment)

A memory device according to a fourth embodiment differs from those according to the first to third embodiments by including both the second oxide region according to the second embodiment and the second insulator according to the third embodiment. Respects overlapping with those of the first to third embodiments will not be described herein.

Figure 13:
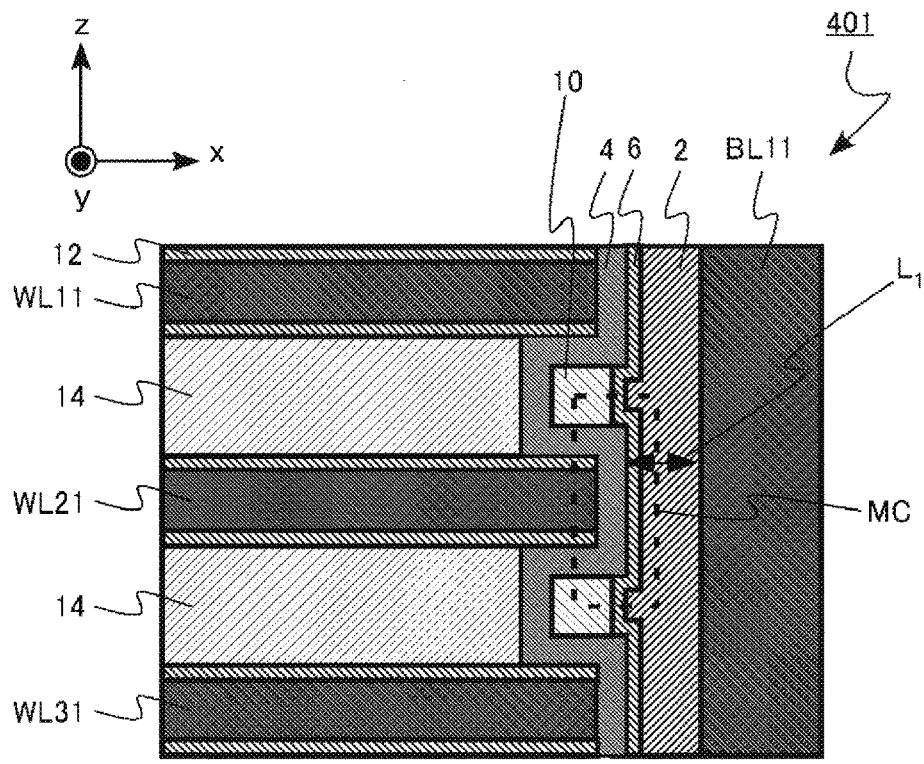
FIG. 13 is a pattern cross-sectional view of a memory device according to a fourth embodiment.

FIG. 13 is a pattern cross-sectional view of a memory cell array 401 of a memory device 400 according to the present embodiment.

According to the present embodiment, it is possible to provide a memory device with further improved reliability.

(Fifth Embodiment)

A memory device according to a fifth embodiment differs from those according to the first to fourth embodiments in that the semiconductor region between the first conductive layer and the second conductive layer contains a p-impurity. Contents overlapping with those of the first to fourth embodiments will not be described herein.

Figure 14:
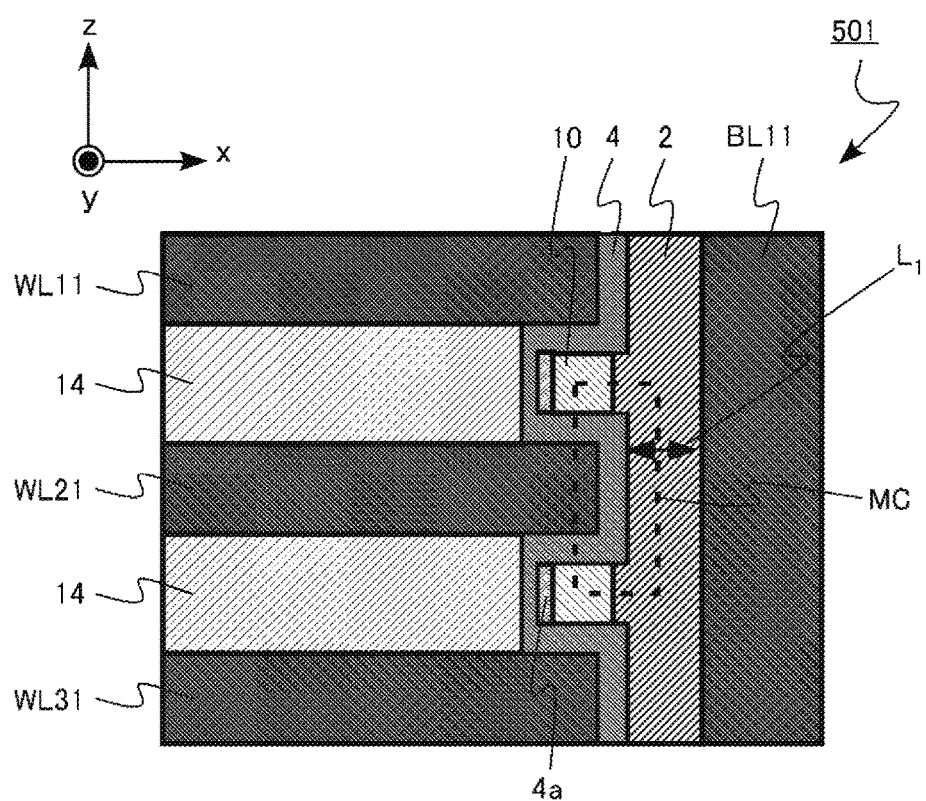
FIG. 14 is a pattern cross-sectional view of a memory device according to a fifth embodiment.

FIG. 14 is a pattern cross-sectional view of a memory cell array 501 of a memory device 500 according to the present embodiment.

In the memory cell array 501, the semiconductor region 4 between the word lines WL21 and WL31 and between the first insulator 10 and the third insulator 14 has a p-region 4a in a portion thereof contiguous to the first insulator 10. For example, boron (B) is used as the p-impurity. This enables a threshold voltage of the virtual TFT to shift to a high voltage side and prevention of the sneak currents.

According to the present embodiment, it is possible to provide a memory device with further improved reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a first conductive layer extending in a first direction;
a second conductive layer extending in the first direction;
a third conductive layer extending in a second direction intersecting the first direction, the third conductive layer including a metal layer;
a first oxide region disposed between the first conductive layer and the third conductive layer and between the second conductive layer and the third conductive layer; and
a semiconductor region disposed between the first conductive layer and the first oxide region and between the first conductive layer and the second conductive layer, wherein
a first distance exists between the semiconductor region, as disposed between the first conductive layer and the first oxide region, and the third conductive layer, and a second distance exists between the semiconductor region, as disposed between the first conductive layer and the second conductive layer, and the third conductive layer, the second distance being longer than the first distance.

2. The memory device according to claim 1, further comprising
a first insulator disposed between the first oxide region and the semiconductor region, the first insulator disposed between the first conductive layer and the second conductive layer.

3. The memory device according to claim 1, further comprising
a second oxide region disposed between the semiconductor region and the first oxide region.

4. The memory device according to claim 1, further comprising
a second insulator disposed between the first conductive layer and the semiconductor region.

5. The memory device according to claim 3, further comprising
a second insulator disposed between the first conductive layer and the semiconductor region.

6. The memory device according to claim 1, wherein the semiconductor region between the first conductive layer and the second conductive layer comprises a p-impurity region.

7. The memory device according to claim 2, wherein the semiconductor region between the first conductive layer and the second conductive layer comprises a p-impurity region contiguous to the first insulator.

8. The memory device according to claim 2, wherein a second film thickness of the first oxide region between the first insulator and the third conductive layer is larger than a first film thickness of the first oxide region between the first conductive layer and the third conductive layer.

9. The memory device according to claim 1, wherein the first oxide region comprises titanium oxide.

10. The memory device according to claim 1, wherein the semiconductor region comprises amorphous silicon.

11. The memory device according to claim 3, wherein the second oxide region comprises aluminum oxide, hafnium oxide, or zirconium oxide.

12. The memory device according to claim 3, wherein the second oxide region has a thickness equal to or less than 0.8 nm.

13. The memory device according to claim 3, wherein the second oxide region is a reaction inhibiting layer inhibiting elements from traveling between the first oxide region and the semiconductor region.

14. The memory device according to claim 2, wherein the dielectric constant of the first insulator is lower than that of the first oxide region.

15. The memory device according to claim 2, wherein the first and second conductive layers comprise word lines, and the third conductive layer comprises a bit line.

16. A method comprising:
forming a first conductive layer extending in a first direction;
forming a second conductive layer extending in the first direction;
forming a third conductive layer extending in a second direction intersecting the first direction, the third conductive layer including a metal layer;
forming a first oxide region between the first conductive layer and the third conductive layer and between the second conductive layer and the third conductive layer; and
forming a semiconductor region between the first conductive layer and the first oxide region and between the first conductive layer and the second conductive layer, wherein
a first distance exists between the semiconductor region, as disposed between the first conductive layer and the first oxide region, and the third conductive layer,
and a second distance exists between the semiconductor region, as disposed between the first conductive layer and the second conductive layer, and the third conductive layer,
the second distance being longer than the first distance.

* * * * *